United States Patent
Sarraf et al.

(10) Patent No.: US 9,474,152 B2
(45) Date of Patent: Oct. 18, 2016

(54) ELECTRONIC DEVICE

(71) Applicant: Tyco Electronics Corporation, Berwyn, PA (US)

(72) Inventors: David Bruce Sarraf, Elizabethtown, PA (US); Charles Randall Malstrom, Lebanon, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 168 days.

(21) Appl. No.: 13/875,062

(22) Filed: May 1, 2013

(65) Prior Publication Data

US 2014/0328036 A1    Nov. 6, 2014

(51) Int. Cl.
| | |
|---|---|
| H05K 1/09 | (2006.01) |
| H05K 3/12 | (2006.01) |
| H05K 3/32 | (2006.01) |
| H01R 12/72 | (2011.01) |
| H05K 1/11 | (2006.01) |
| H05K 3/40 | (2006.01) |
| H01Q 1/24 | (2006.01) |
| H01Q 1/38 | (2006.01) |

(52) U.S. Cl.
CPC ............ *H05K 1/092* (2013.01); *H01R 12/728* (2013.01); *H05K 1/11* (2013.01); *H05K 3/12* (2013.01); *H05K 3/32* (2013.01); *H05K 3/4015* (2013.01); *H01Q 1/243* (2013.01); *H01Q 1/38* (2013.01); *H05K 2201/0311* (2013.01); *H05K 2201/0999* (2013.01); *H05K 2201/1034* (2013.01); *H05K 2201/10295* (2013.01); *H05K 2201/10386* (2013.01); *Y10T 29/4913* (2015.01)

(58) Field of Classification Search
CPC ......... H05K 1/092; H05K 1/11; H05K 1/112

USPC .......................... 361/760, 765, 785; 174/257
See application file for complete search history.

(56) References Cited

U.S. PATENT DOCUMENTS

| | | | | |
|---|---|---|---|---|
| 2,756,485 | A | | 7/1956 | Abramson et al. |
| 4,181,387 | A | * | 1/1980 | Walters .................. H01R 9/091 29/838 |
| 4,392,181 | A | * | 7/1983 | Jabben .................. H01R 9/096 361/761 |
| 5,945,637 | A | * | 8/1999 | Katsumata ............. H01R 9/091 174/267 |

(Continued)

FOREIGN PATENT DOCUMENTS

| | | |
|---|---|---|
| CN | 102610910 A | 7/2012 |
| EP | 2544300 A1 | 1/2013 |

OTHER PUBLICATIONS

International Search Report, International Application No. PCT/US2014/034790, International Filing Date, Apr. 21, 2014.

*Primary Examiner* — Courtney Smith
*Assistant Examiner* — Jessey R Ervin

(57) ABSTRACT

An electronic device includes a dielectric substrate having a first surface, a conductive circuit deposited on the first surface and having a printed conductive ink trace on the first surface, and a conductive interposer mechanically coupled to the substrate. The conductive interposer is electrically coupled to the conductive circuit. The conductive interposer has a separable contact interface configured to be mechanically and electrically connected to a removable contact. Optionally, the conductive interposer may include a main body and a flexible element extending between the main body and the conductive circuit. The flexible element electrically connects the conductive circuit with the main body.

19 Claims, 2 Drawing Sheets

(56) References Cited

U.S. PATENT DOCUMENTS 6,421,013 B1 * 7/2002 Chung .............. G06K 19/07749 235/441

2012/0055701 A1 * 3/2012 Rathburn ............... H01R 12/57 174/254

2013/0076572 A1 * 3/2013 Lee .......................... C09D 5/24 343/700 MS

* cited by examiner

ELECTRONIC DEVICE

BACKGROUND OF THE INVENTION

The subject matter herein relates generally to electronic devices and methods of manufacturing electronic devices.

Electronic devices typically include conductors that electrically connect components of the electronic device. Some electronic devices have circuit boards with conductive traces deposited on the substrate as a conductive layer in a predefined pattern or layout. Contacts or wires may be terminated to the traces, such as by spring contact, soldering or the like. Conventional circuit boards have good wear properties and are not readily damaged during mating or unmating of the contacts.

However, some electronic devices have been proposed that are manufactured by printing conductive ink on the substrate and then possibly plating the conductive ink to increase the current carrying capacity of the conductive circuits. Circuit traces manufactured as such are susceptible to wear or damage from scraping by the contacts when mated to or unmated from such traces. Additionally, some electronic devices have been proposed that provide circuit traces without the use of traditional circuit boards by printing the conductive ink traces directly onto another substrate, such as a case or housing of the electronic device, which may reduce the overall size of the electronic devices.

A need remains for an electronic device that includes durable circuit traces for mating and/or unmating of contacts thereto.

BRIEF DESCRIPTION OF THE INVENTION

In one embodiment, an electronic device is provided that includes a dielectric substrate having a first surface, a conductive circuit deposited on the first surface and having a printed conductive ink trace on the first surface, and a conductive interposer mechanically coupled to the substrate. The conductive interposer is electrically coupled to the conductive circuit. The conductive interposer has a separable contact interface configured to be mechanically and electrically connected to a removable contact.

Optionally, the conductive interposer may include a main body extending through the conductive circuit into the substrate that fixes the relative position between the conductive interposer and the substrate. The conductive interposer may include an arm extending from the main body along the first surface. The conductive circuit may be positioned between the arm and the first surface. The arm may define the separable contact interface.

Optionally, the conductive interposer may include a main body and a flexible element extending between the main body and the conductive circuit. The flexible element electrically connects the conductive circuit with the main body. The conductive interposer may include a flexible, conductive gasket directly engaging and being electrically connected to the conductive circuit. The conductive interposer may include a flexible spring beam directly engaging and being electrically connected to the conductive circuit.

Optionally, the conductive interposer may be connected to the conductive circuit along a wiping contact surface. The conductive interposer may allow non-damaging wiping to occur between the conductive interposer and the conductive circuit.

Optionally, the printed conductive ink trace may be applied to the first surface and to the conductive interposer. The conductive circuit may include an antenna and the contact may be a feed line attached to the antenna by the conductive interposer.

Optionally, the substrate may be a case of the electronic device configured to hold electronic components therein. The conductive circuit may be applied directly to the case. The first surface may be non-planar having at least one transition. The printed conductive ink trace may be applied to the non-planar first surface across the at least one transition.

In another embodiment, an electronic device is provided having a dielectric substrate having a first surface and a conductive circuit deposited on the first surface. The conductive circuit includes a printed conductive ink trace on the first surface. A conductive interposer is mechanically coupled to the substrate. The conductive interposer has a main body and a flexible element extending between the main body and the conductive circuit. The flexible element electrically connects the conductive circuit and the main body. The main body has a separable contact interface configured to be mechanically and electrically connected to a removable contact.

In a further embodiment, a method of manufacturing an electronic device is provided including printing a conductive ink trace on the substrate to form a conductive circuit on the substrate, coupling a conductive interposer to the substrate such that the conductive interposer is electrically coupled to the conductive circuit, and removably coupling a contact to the conductive interposer at a separable contact interface.

DETAILED DESCRIPTION OF THE INVENTION

Embodiments described herein may provide an electronic device having improved wear life of conductive circuits of the electronic device. Embodiments described herein may provide a printed conductive ink trace on a surface of a dielectric substrate. Embodiments described herein may provide a separate conductive interposer electrically coupled to the printed conducted ink trace having a contact interface for a contact or other conductive component to be electrically connected to the conductive circuit defined by the printed conductive ink trace. The conductive interposer between the conductive circuit and the other contact eliminates mating to and unmating from the conductive circuit by the other contact, which reduces wear on the conductive circuit. For example, movement between the contact and the conductive circuit, such as during mating and unmating, may cause scraping of the printed conductive ink trace, which can damage or destroy the conductive circuit.

Figure 1:
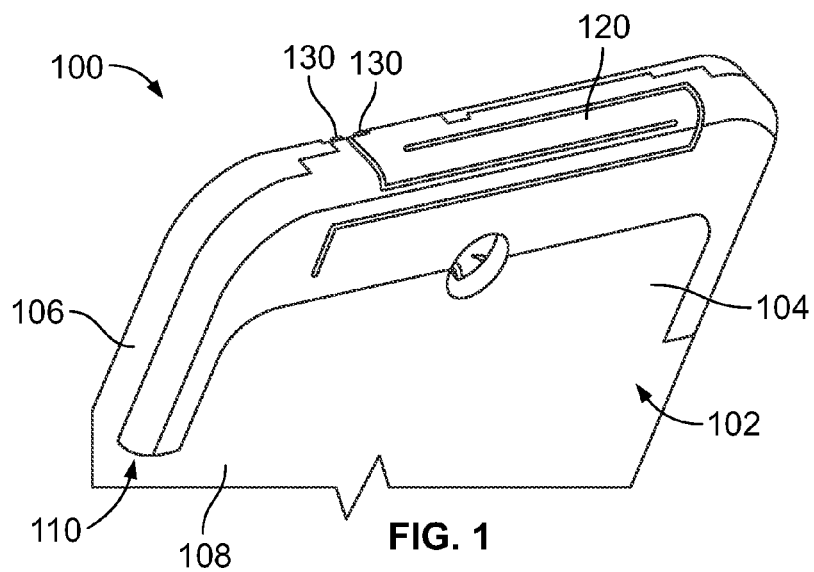
FIG. 1 illustrates an electronic device formed in accordance with an exemplary embodiment.

FIG. 1 illustrates an electronic device 100 formed in accordance with an exemplary embodiment. The electronic device 100 includes a substrate 102 having a first surface 104. In the illustrated embodiment, the substrate 102 is a housing or case of the electronic device 100, which may be a cell phone, PC tablet, computer, GPS device, or other type of electronic device. The substrate 102 may be manufactured from a plastic material. The substrate 102 may be non-planar and include walls 106, 108 extending from one another in non-planar orientations. Transitions 110 are defined between the walls 106, 108. The transitions 110 may define a corner of the substrate 102. The first surface 104 extends along the walls 106, 108 and across the transitions 110. While the substrate 102 is illustrated as being a housing or case of an electronic device 100, other types of substrates may be used in alternative embodiments. For example, the substrate may define a printed circuit board or may be another type of substrate.

The walls 106, 108 are integrally formed and made from a dielectric material, such as an injection molded polymer, a machined polymer, an extruded polymer, a flexible film, a synthetic composite material, a glass material, a ceramic material, a dielectric coated metal material, or any other appropriate dielectric material for the particular application. The inner surfaces of the walls 106, 108 define a cavity that holds electronic components, such as batteries, processors, cameras, displays and the like. Such electronic components may be electrically connected to the conductive circuits 120.

In an exemplary embodiment, the electronic device 100 includes one or more conductive circuits 120 deposited on one or more surfaces, such as the first surface 104, of the substrate 102. Any number of conductive circuits 120 may be provided on the electronic device 100. The conductive circuits 120 may be provided on the outer surface and/or the inner surface of the substrate 102. In an exemplary embodiment, the conductive circuit 120 includes a printed conductive ink trace that is printed on the first surface 104. The conductive circuit may be deposited by other means in alternative embodiments.

The printed conductive ink trace may be printed onto the first surface 104 of the substrate 102 by pad printing conductive ink in a predefined pattern on the first surface 104. The printed conductive ink trace may be deposited by other processes or means in alternative embodiments. For example, the printed conductive ink trace may be screen printed, ink jet printed or laser printed on the first surface 104 in alternative embodiments. In an exemplary embodiment, the printing technique for the conductive ink traces allows for printing on non-planar surfaces. The printing technique for the conductive ink traces allows the conductive ink to be transitioned along a curved surface, such as across the transitions 110 between the walls 106, 108. The printed conductive ink traces may be connected together to form a common circuit, or multiple printed conductive traces may be provided on the substrate 102 independent from other printed conductive ink traces to define different conductive circuits 120.

The printed conductive ink traces may operate as a seed layer that is later plated, such as by electroplating, to increase the conductivity and thus current carrying capacity of the conductive circuits 120. In alternative embodiments, the conductive circuit 120 may be manufactured without plating or depositing additional conductive material over the printed conductive ink traces as the printed conductive ink traces may have enough current carrying capacity. The printed conductive ink trace may be applied in multiple layers to increase the current carrying capacity of the conductive circuit 120 without the need for plating an additional layer over the printed conductive ink traces.

The electronic device 100 includes a conductive interposer 130 mechanically coupled to the substrate 102. For example, the conductive interposer 130 may be held in the substrate by a friction fit, by adhesive, by a fastener or by other means. The conductive interposer 130 is electrically coupled to the conductive circuit 120. The conductive interposer 130 defines an interface configured to be mechanically and electrically connected to another electronic component, such as a battery, processor, camera, display, circuit board, antenna feed, wire or contact of the electronic device 100. Providing the conductive interposer 130 between the conductive circuit 120 and any other component of the electronic device 100 protects the conductive circuit 120 from wear or damage as the electronic component directly engages the conductive interposer 130 and does not directly engage the conductive circuit 120.

In an exemplary embodiment, the conductive circuit 120 defines an antenna on the outer surface of the case defined by the substrate 102, and may be referred to hereinafter as antenna 120. Optionally, the antenna 120 may be provided on the inner surfaces in addition to, or in the alternative to, the outer surfaces of the walls 106 and/or 108. Optionally, the printed conductive ink trace defining the antenna 120 may be printed on both walls 106, 108 during a single, continuous printing process. For example, the pad may roll across the transition 110 at the corner of the walls 106, 108 to deposit conductive ink on the surfaces thereof. The printed conductive ink trace may then be plated, such as by electroplating. The conductive circuit 120 may define other types of circuits or elements in other embodiments other than an antenna, such as a circuit trace, an inductor, a capacitor, and the like by controlling where the conductive ink traces are printed and/or by printing stacked layers of conductive ink traces. For example, dielectric layers may be added between layers of the printed conductive ink traces.

Figure 2:
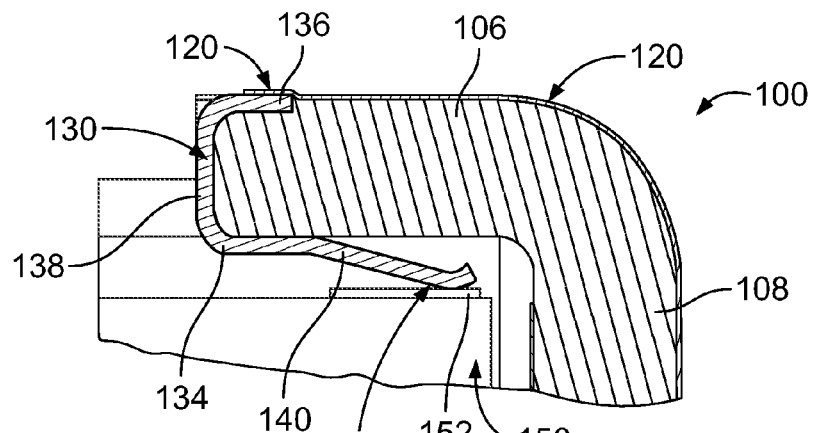
FIGS. 2-6 are cross sectional views of electronic devices formed in accordance with an exemplary embodiment.

FIG. 2 is a cross sectional view of the electronic device 100. The conductive interposer 130 extends through the substrate 102 from an exterior of the substrate 102 to an interior of the substrate 102. The interior of the substrate 102 may form a cavity or chamber that receives other electronic components, such as batteries, processors, cameras, displays, circuit board, and the like. Other arrangements of the substrate 102, conductive interposer 130 and conductive circuit 120 are possible in alternative embodiments, such as having the conductive circuit 120 on the interior and the conductive interposer 130 passing from the interior to the exterior of the substrate, having both the conductive interposer 130 and conductive circuit 120 on the interior of the substrate 102, having both the conductive interposer 130 and conductive circuit 120 on the exterior of the substrate, and the like.

The conductive interposer 130 has a contact interface 132 configured to mechanically and electrically connected to an electronic component 150. For example, the electronic component 150 may have a contact 152 that directly engages the conductive interposer 130 at the contact interface 132. In an exemplary embodiment, the contact interface 132 defines a separable contact interface where the contact 152 is configured to be connected to and removed from the contact interface 132 multiple times. For example, during assembly, the contact 152 may engage the contact interface 132 to create an electrical connection between the electronic component 150 and the conductive interposer 130; however the electronic component 150 and the contact 152 may be removed from the case. Removal of the contact 152 from the contact interface 132 does not damage the conductive interposer 130.

The contact 152 may be spring biased against the contact interface 132. For example, the contact 152 may include a spring beam or a pogo pin that is biased against the contact interface 132. Other types of contact may be provided in alternative embodiments. Optionally, the contact 152 may be permanently secured to the contact interface 132, such as by soldering the contact 152 to the conductive interposer 130 at the contact interface 132. In other alternative embodiments, the contact 152 may be a wire or other type of conductor that is electrically connected to the conductive interposer 130 at the contact interface 132.

Using the conductive interposer 130 eliminates the need for directly attaching the contact 152 to the conductive circuit 120. Damage to the conductive circuit 120 is this reduced or eliminated as wiping or scraping of the conductive circuit 120 does not occur during mating and/or unmating of the contact 152.

In the illustrated embodiment, the conductive circuit 120 is applied to the conductive interposer 130. For example, the conductive interposer 130 is mechanically attached to the substrate 102 prior to printing the conductive ink trace on the substrate 102. When the conductive ink trace is printed on the substrate 102, the conductive ink trace is also printed onto a surface of the conductive interposer 130 during a single, continuous printing process. Alternatively, the conductive interposer 130 may be coupled to the substrate 102 after the conductive ink trace is printed on the substrate 102. The conductive interposer 130 is brought into electrical contact with the conductive circuit 120 and is held in place by the substrate 102 such that little or no movement occurs between the conductive interposer 130 and the conductive circuit 120 after the conductive interposer 130 is coupled to the substrate 102. For example, during mating and unmating of the contact 152 with the conductive interposer 130 the conductive interposer 130 does not move relative to the circuit 120 and thus no wear or damage occurs to the conductive circuit 120.

In an exemplary embodiment, the conductive interposer 130 includes a main body 134 including an arm 136 and a post 138 extending from the arm 136. The post 138 of the main body 134 extends through the substrate 102. The arm 136 is provided on an exterior of the substrate 102 and the conductive circuit 120 is electrically connected to the conductive interposer 130 at the arm 136. The arm 136 is fixed relative to the substrate 102 and the conductive circuit 120 such that little or no movement occurs between the arm 136 and the conductive circuit 120. A beam portion 140 of the main body 134 extends from the post 138 generally opposite the arm 136. The contact interface 134 is formed on the beam portion 140 of the main body 134. The beam portion 140 may be deflectable, such as during mating with the electronic component 150.

Figure 3:
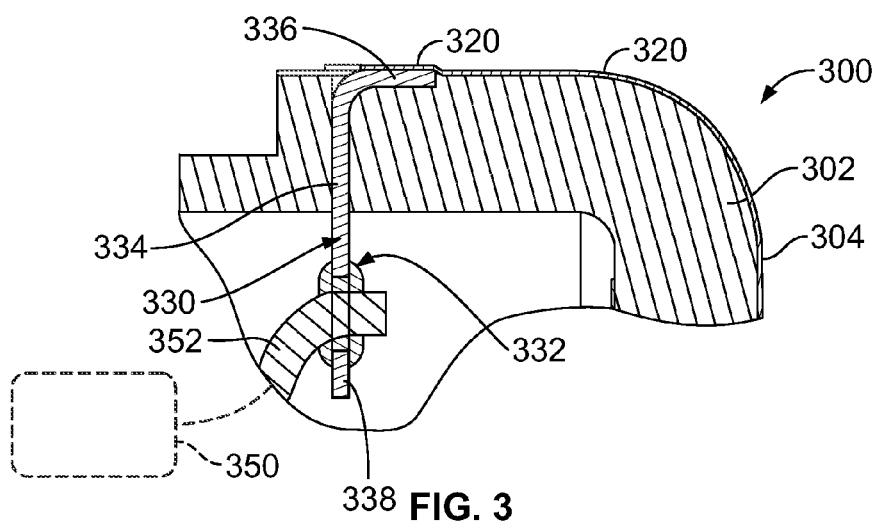

FIG. 3 is a cross sectional view of an electronic device 300 formed in accordance with an exemplary embodiment. The electronic device 300 is similar to the electronic device 100 (shown in FIG. 1); however the electronic device 300 has a differently shaped contact interposer configured to mate to a different type of contact.

The electronic device includes a substrate 302 having a first surface 304. The electronic device 300 includes one or more conductive circuits 320 deposited on one or more surfaces, such as the first surface 304, of the substrate 302. In an exemplary embodiment, the conductive circuit 320 includes a printed conductive ink trace that is printed on the first surface 304; however the conductive circuit 320 may be deposited by other means in alternative embodiments.

The electronic device 300 includes a conductive interposer 330 mechanically coupled to the substrate 302. The conductive interposer 330 is electrically coupled to the conductive circuit 320. The conductive interposer 330 has a contact interface 332 configured to mechanically and electrically connect to an electronic component 350. For example, the electronic component 350 may have a contact 352 in the form of a wire that is directly soldered to the conductive interposer 330 at the contact interface 332.

In an exemplary embodiment, the conductive interposer 330 includes a main body 334 having an arm 336 and a post 338 extending from the arm 336. The main body 334 extends through the substrate 302. The arm 336 is provided on an exterior of the substrate 302 and the conductive circuit 320 is electrically connected to the conductive interposer 330 at the arm 336. The arm 336 is fixed relative to the substrate 302 and the conductive circuit 320 such that little or no movement occurs between the arm 336 and the conductive circuit 320. The post 338 defines a solder tab for connection of the contact 352 to the conductive interposer 330. The contact interface 332 is formed on the post 338 of the main body 334.

Providing the conductive interposer 330 between the conductive circuit 320 and the electronic component 350 of the electronic device 300 protects the conductive circuit 320 from wear or damage as the wire directly engages the conductive interposer 330 and does not directly engage the conductive circuit 320. The conductive interposer 330 may be a stamped and formed metal terminal that may be readily and easily soldered to, whereas the conductive circuit may be more difficult to solder directly to. Using the conductive interposer 330 eliminates the need for directly attaching the contact 352 to the conductive circuit 320. Damage to the conductive circuit 320 is this reduced or eliminated.

Figure 4:
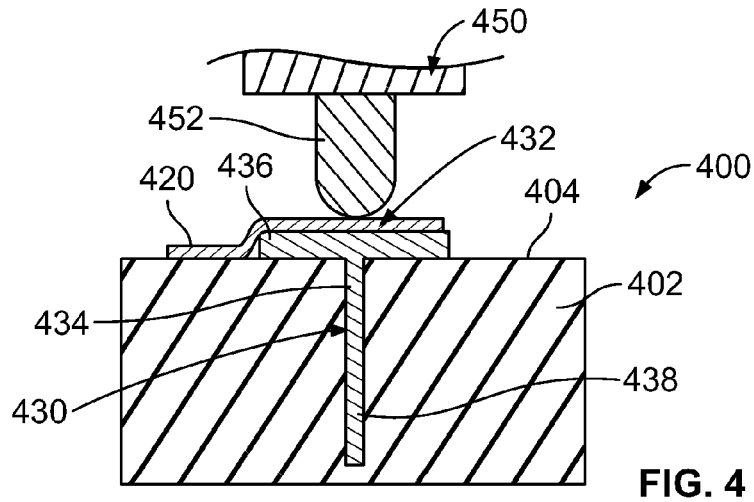

FIG. 4 is a cross sectional view of an electronic device 400 formed in accordance with an exemplary embodiment. The electronic device 400 is similar to the electronic devices 100, 300 (shown in FIGS. 2 and 3, respectively); however the electronic device 400 has a differently shaped contact interposer configured to mate to a different type of contact.

The electronic device includes a substrate 402 having a first surface 404. The electronic device 400 includes one or more conductive circuits 420 deposited on one or more surfaces, such as the first surface 404, of the substrate 402. In an exemplary embodiment, the conductive circuit 420 includes a printed conductive ink trace that is printed on the first surface 404; however the conductive circuit 420 may be deposited by other means in alternative embodiments.

The electronic device 400 includes a conductive interposer 430 mechanically coupled to the substrate 402. The conductive interposer 430 is electrically coupled to the conductive circuit 420. In the illustrated embodiment, the conductive circuit 420 extends along the conductive interposer 430. For example, the conductive circuit 420 may transition from the substrate 402 along the surface of the conductive interposer 430. Optionally, the conductive interposer 430 may be recessed our countersunk in the substrate 402 to provide a smooth or flat transition between the substrate and the conductive interposer 430 overwhich the conductive circuit 420 transitions.

The conductive interposer 430 has a contact interface 432 configured to mechanically and electrically connect to an electronic component 450. For example, the electronic component 450 may have a contact 452 that is configured to be mated to and unmated from the conductive interposer 430 at the separable contact interface 432. In the illustrated embodiment, the contact 452 may directly engage the conductive circuit 420 in addition to or in the alternative to the conductive interposer 430. Optionally, the conductive interposer 430 may be a backing surface behind the conductive circuit 420, wherein if the conductive circuit 420 is worn or scraped off of the conductive interposer 430 in the mating area, the contact 452 would still engage the conductive interposer 430, which is electrically connected to the conductive circuit 420 at other, non-worn or non-damaged areas. The contact 452 may be a spring beam, a pogo-pin or another type of contact configured to connect to the contact interface 432. The contact 452 may be soldered to the contact interface 432 in other embodiments.

In other embodiments, rather than having the conductive circuit 420 at the contact interface 432, the conductive circuit 420 may be deposited on the conductive interposer 430 in an area away from the contact 452 such that the contact 452 does not directly engage the conductive circuit 420, but rather engages the conductive circuit 420 via the conductive interposer 430. Problems with wearing or scraping of the conductive circuit 420 are reduced in such embodiments.

In an exemplary embodiment, the conductive interposer 430 includes a main body 434 having an arm 436 and a post 438. The post 438 extends through the substrate 402. In the illustrated embodiment, the arm 436 extends outward from the post 438 in more than one direction. For example, the arm 436 may extend in two directions or the arm 436 may extend in more directions, such as radially outward in all directions forming a circular cap over the post 438. The arm 436 is electrically connected to the conductive circuit 420, such as by direct physical contact therebetween. The contact interface 432 is formed on the arm 436.

Figure 5:
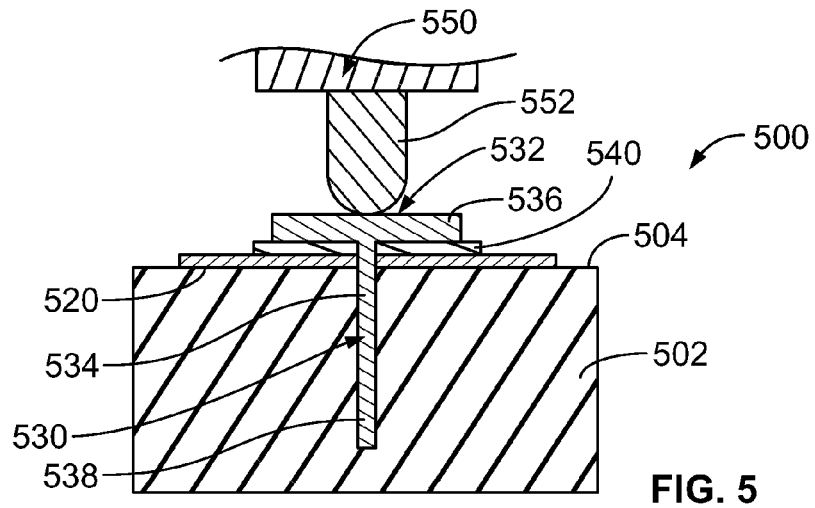

FIG. 5 is a cross sectional view of an electronic device 500 formed in accordance with an exemplary embodiment. The electronic device 500 is similar to the electronic devices 100, 300, 400 (shown in FIGS. 2, 3 and 4, respectively); however the electronic device 500 has a differently shaped contact interposer.

The electronic device includes a substrate 502 having a first surface 504. The electronic device 500 includes one or more conductive circuits 520 deposited on one or more surfaces, such as the first surface 504, of the substrate 502. In an exemplary embodiment, the conductive circuit 520 includes a printed conductive ink trace that is printed on the first surface 504; however the conductive circuit 520 may be deposited by other means in alternative embodiments.

The electronic device 500 includes a conductive interposer 530 mechanically coupled to the substrate 502. The conductive interposer 530 is electrically coupled to the conductive circuit 520. In the illustrated embodiment, the conductive circuit 520 extends along the substrate 502 between the substrate 502 and the conductive interposer 530. The conductive interposer 530 has a contact interface 532 configured to mechanically and electrically connect to an electronic component 550. For example, the electronic component 550 may have a contact 552 that is configured to be mated to and unmated from the conductive interposer 530 at the separable contact interface 532. The contact 552 may be a spring beam, a pogo-pin or another type of contact configured to connect to the contact interface 532. The contact 552 may be soldered to the contact interface 532 in other embodiments.

In an exemplary embodiment, the conductive interposer 530 includes a main body 534 having an arm 536 and a post 538. The post 538 extends through the substrate 502. The arm 536 extends outward from the post 538. The contact interface 532 is formed on the arm 536.

A flexible element 540 is positioned between the arm 536 and the conductive circuit 520. The flexible element 540 is electrically conductive. The flexible element 540 is compliant, such as to accommodate for thermal expansion of the conductive interposer 530 and/or the substrate 502, to accommodate for movement of the conductive interposer 530 during mating and/or unmating of the contact 552, or to accommodate for other movements. The arm 536 is electrically connected to the conductive circuit 520 by the flexible element 540, which is in direct physical contact with the arm 536 and with the conductive circuit 520. In an exemplary embodiment, the flexible element 540 is a gasket, such as a felt metal gasket, a conductive polymer gasket, and the like. The flexible element 540 may be another type of conductive element in alternative embodiments, such as a wavy washer. The flexible element 540 may avoid damaging wiping from occurring to the conductive circuit 520. The flexible element 540 may produce sliding wiping across the conductive circuit 520, which is non-damaging to the conductive circuit, but may avoid scraping wiping from occurring to the conductive circuit 520. The flexible element 540 may have a large amount of surface area in contact with the conductive circuit 520, such as a portion (e.g. a majority or substantially all) of the area under the arm 536. The post 538 may extend through the conductive circuit 520 at the point where the post 538 extends into the substrate 502.

Providing the conductive interposer 530 between the conductive circuit 520 and the electronic component 550 of the electronic device 500 protects the conductive circuit 520 from wear or damage as the contact 552 directly engages the conductive interposer 530 and does not directly engage the conductive circuit 520. Providing the flexible element 540 between the arm 536 and the conductive circuit 520 further protects the conductive circuit 520 from movement of the conductive interposer 530. Damage to the conductive circuit 520 is this reduced or eliminated.

Figure 6:
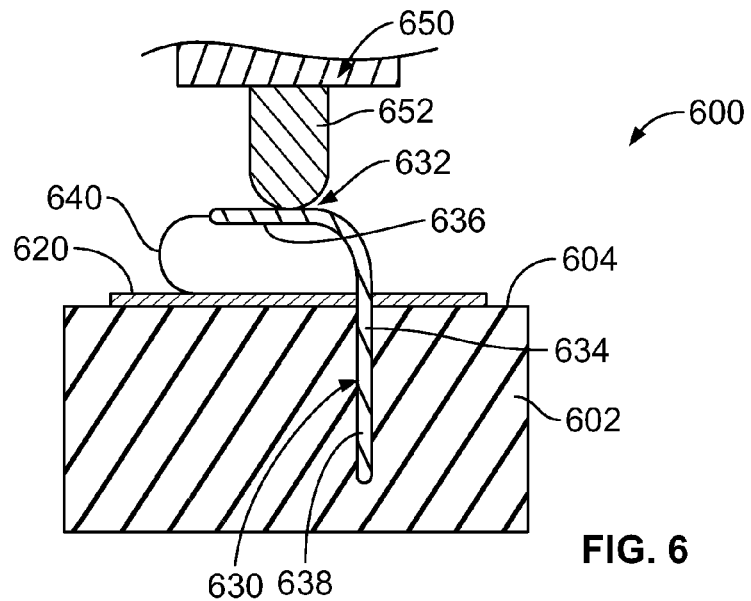

FIG. 6 is a cross sectional view of an electronic device 600 formed in accordance with an exemplary embodiment. The electronic device 600 is similar to the electronic devices 100, 300, 400, 500 (shown in FIGS. 2, 3, 4 and 5, respectively); however the electronic device 600 has a differently shaped contact interposer.

The electronic device includes a substrate 602 having a first surface 604. The electronic device 600 includes one or more conductive circuits 620 deposited on one or more surfaces, such as the first surface 604, of the substrate 602. In an exemplary embodiment, the conductive circuit 620 includes a printed conductive ink trace that is printed on the first surface 604; however the conductive circuit 620 may be deposited by other means in alternative embodiments.

The electronic device 600 includes a conductive interposer 630 mechanically coupled to the substrate 602. The conductive interposer 630 is electrically coupled to the conductive circuit 620. In the illustrated embodiment, the conductive circuit 620 extends along the substrate 602 between the substrate 602 and the conductive interposer 630. The conductive interposer 630 has a contact interface 632 configured to mechanically and electrically connect to an electronic component 650. For example, the electronic component 650 may have a contact 652 that is configured to be mated to and unmated from the conductive interposer 630 at the separable contact interface 632. The contact 652 may be a spring beam, a pogo-pin or another type of contact configured to connect to the contact interface 632. The contact 652 may be soldered to the contact interface 632 in other embodiments.

In an exemplary embodiment, the conductive interposer 630 includes a main body 634 having an arm 636 and a post 638. The post 638 extends through the substrate 602. The arm 636 extends outward from the post 638. The contact interface 632 is defined by the arm 636.

A flexible element 640 is positioned between the arm 636 and the conductive circuit 620. The flexible element 640 is electrically conductive. The flexible element 640 is compliant to accommodate for movement of the conductive interposer 630 relative to the conductive circuit 620. In the illustrated embodiment, the flexible element 640 is integrally formed (e.g. stamped and formed therewith) with the arm 636 and extends therefrom. The flexible element 640 may be thinner, and thus more compliant, than the arm 636, which is thicker and stiffer than the flexible element 640. The arm 636 can thus better withstand forces exerted by the contact 652 during mating, causing less movement of the conductive interposer 630 during mating and unmating with the contact 652.

The arm 636 is electrically connected to the conductive circuit 620 by the flexible element 640, which is in direct physical contact with the arm 636 and with the conductive circuit 620. In an exemplary embodiment, the flexible element 640 is a spring beam cantilevered from and bent under the arm 636. The flexible element 640 may avoid damaging wiping from occurring to the conductive circuit 620. The flexible element 640 may produce sliding wiping across the conductive circuit 620, which is non-damaging to the conductive circuit, but may avoid scraping wiping from occurring to the conductive circuit 620. The flexible element 640 may have a large amount of surface area in contact with the conductive circuit 620, such as a long portion of the distal end of the flexible element 640 folded under and in contact with the conductive circuit 620.

Providing the conductive interposer 630 between the conductive circuit 620 and the electronic component 650 of the electronic device 600 protects the conductive circuit 620 from wear or damage as the contact 652 directly engages the conductive interposer 630 and does not directly engage the conductive circuit 620. Providing the flexible element 640 between the arm 636 and the conductive circuit 620 further protects the conductive circuit 620 from movement of the conductive interposer 630. Damage to the conductive circuit 620 is this reduced or eliminated.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electronic device comprising: a dielectric substrate having a first surface; a conductive interposer mechanically coupled to the substrate, the conductive interposer having a post extending into the dielectric substrate and an arm positioned proximate to the first surface, the conductive interposer having a contact interface mechanically and electrically connected to a contact; and a conductive circuit deposited on the first surface of the substrate and deposited on the arm of the conductive interposer with the conductive circuit spanning between the first surface of the substrate and the arm of the conductive interposer, the conductive circuit comprising a printed conductive ink trace, wherein the printed conductive ink trace of the conductive circuit is applied on the arm of the conductive interposer in addition to the first surface of the substrate such that the conductive interposer is electrically coupled to the conductive circuit with the conductive interposer providing the electrical connection between the contact and the conductive circuit.

2. The electronic device of claim 1, wherein the post extending through the substrate to a position at or beyond a second surface of the substrate opposite the first surface of the substrate, the post fixing the relative position between the conductive interposer and the substrate.

3. The electronic device of claim 1, wherein the arm extending from the post along the first surface such that the arm is generally coplanar with the first surface, the conductive circuit spanning across the interface between the arm and the first surface, the arm defining the contact interface.

4. The electronic device of claim 1, wherein the conductive interposer comprises a main body including the post and the arm, the main body defining the contact interface with the contact, such contact interface being a separable contact interface allowing the contact to be removed from the conductive interposer, the conductive circuit being provided on a portion of the arm remote from the contact interface.

5. The electronic device of claim 1, wherein the conductive interposer is connected to the conductive circuit at an interface remote from the contact interface where contact wiping occurs creating a non-damaging electrical connection between the contact and the conductive circuit via the conductive interposer.

6. The electronic device of claim 1, wherein the printed conductive ink trace is applied to the first surface and to the conductive interposer after the conductive interposer is mechanically coupled to the substrate such that the printed conductive ink trace spans an interface between the conductive interposer and the substrate.

7. The electronic device of claim 1, wherein the conductive circuit comprises an antenna, the contact comprises a feed line attached to the antenna by the conductive interposer.

8. The electronic device of claim 1, wherein the substrate comprises a case of the electronic device, the conductive circuit being applied directly to the case, the case holding electronic components therein.

9. The electronic device of claim 1, wherein the first surface is non-planar having at least one transition, the printed conductive ink trace being applied to the non-planar first surface across the at least one transition.

10. An electronic device comprising: a dielectric substrate having a first surface; a conductive circuit deposited on the first surface, the conductive circuit comprising a printed conductive ink trace on the first surface, the printed conductive ink trace being susceptible to damage from contact wiping forces; and a conductive interposer mechanically coupled to the substrate, the conductive interposer having a main body including a flat upper surface at a top of the main body being parallel to and above the first surface, and the conductive interposer having a flexible element extending between the main body and the conductive circuit, the flexible element electrically connecting the conductive circuit and the main body, the main body having a separable contact interface defined by and on the flat upper surface mechanically and electrically connected to a removable contact, wherein contact wiping occurs at the separable contact interface and the main body is subjected to contact wiping forces when contact wiping occurs, the flexible element being connected to the conductive circuit at an interface remote from the separable contact interface, the interface between the flexible element and the conductive circuit being subjected to mating forces less damaging than the contact wiping forces to create a non-damaging electrical connection between the flexible element and the conductive circuit.

11. The electronic device of claim 10, wherein the main body comprises an arm extending along the first surface, the arm defining the flat upper surface, the conductive circuit being positioned between a lower surface of the arm and the first surface, the flexible element extending between the lower surface of the arm and the conductive circuit.

12. The electronic device of claim 10, wherein the flexible element comprises a flexible, conductive gasket directly engaging and being electrically connected to the conductive circuit.

13. The electronic device of claim 10, wherein the flexible element comprises a flexible spring beam integral with the main body and directly engaging and being electrically connected to the conductive circuit.

14. The electronic device of claim 1, wherein the contact interface is a solder interface soldered to the contact, the conductive interposer defining an electrical path between the conductive circuit and the soldered contact.

15. The electronic device of claim 1, wherein the arm includes in inner surface facing and engaging the first surface and an outer surface opposite the inner surface, the printed conductive ink trace of the conductive circuit being applied on the outer surface of the arm of the conductive interposer.

16. The electronic device of claim 10, wherein the conductive interposer is connected to the conductive circuit at an interface remote from the contact interface where contact wiping occurs creating a non-damaging electrical connection between the contact and the conductive circuit via the conductive interposer.

17. The electronic device of claim 10, wherein the conductive circuit comprises an antenna, the contact comprises a feed line attached to the antenna by the conductive interposer.

18. The electronic device of claim 10, wherein the substrate comprises a case of the electronic device, the conductive circuit being applied directly to the case, the case holding electronic components therein.

19. The electronic device of claim 10, wherein the first surface is non-planar having at least one transition, the printed conductive ink trace being applied to the non-planar first surface across the at least one transition.

* * * * *